United States Patent
Shachal et al.

(10) Patent No.: US 8,492,716 B2
(45) Date of Patent: Jul. 23, 2013

(54) VACUUMED DEVICE AND A SCANNING ELECTRON MICROSCOPE

(75) Inventors: Dov Shachal, Rehovot (IL); Rafi De Picciotto, Carmei Yosef (IL)

(73) Assignee: B-Nano Ltd., Omer (IL)

( * ) Notice: Subject to any disclaimer, the term of this patent is extended or adjusted under 35 U.S.C. 154(b) by 19 days.

(21) Appl. No.: 13/120,344

(22) PCT Filed: Sep. 24, 2009

(86) PCT No.: PCT/IL2009/000926
§ 371 (c)(1),
(2), (4) Date: May 9, 2011

(87) PCT Pub. No.: WO2010/035265
PCT Pub. Date: Apr. 1, 2010

(65) Prior Publication Data
US 2011/0210247 A1    Sep. 1, 2011

Related U.S. Application Data

(60) Provisional application No. 61/100,735, filed on Sep. 28, 2008.

(51) Int. Cl.
*G01N 23/00* (2006.01)
(52) U.S. Cl.
USPC ............ 250/311; 250/307; 250/309; 250/310
(58) Field of Classification Search
USPC .................................. 250/307, 309, 311, 310
See application file for complete search history.

(56) References Cited

U.S. PATENT DOCUMENTS

| 3,307,066 A |   | 2/1967  | Shapiro et al. |
|-------------|---|---------|----------------|
| 3,517,126 A | * | 6/1970  | Sano et al. .................... 348/772 |
| 3,787,696 A |   | 1/1974  | Dao et al. |
| 4,058,724 A | * | 11/1977 | McKinney et al. ............... 850/9 |
| 4,992,662 A | * | 2/1991  | Danilatos .......................... 850/9 |
| 5,081,353 A |   | 1/1992  | Yamada et al. |
| 5,811,803 A | * | 9/1998  | Komatsu et al. .............. 250/310 |
| 6,005,540 A |   | 12/1999 | Shinjo et al. |

(Continued)

FOREIGN PATENT DOCUMENTS

| EP | 1 515 358 A2 | 3/2005 |
| WO | WO 89/01698  | 2/1989 |

(Continued)

OTHER PUBLICATIONS

An International Preliminary Report dated Apr. 7, 2011, which issued during the prosecution of Applicant's PCT/IL09/00926.

(Continued)

*Primary Examiner* — David A Vanore
(74) *Attorney, Agent, or Firm* — Sughrue Mion, PLLC

(57) ABSTRACT

A vacuumed device that includes: a sealed housing, an electron beam source, an electron optic component, a thin membrane, and a detector. The thin membrane seals an aperture of the sealed housing. The sealed housing defines a vacuumed space in which vacuum is maintained. The electron beam source is configured to generate an electron beam that propagates within the vacuumed space, interacts with the electron optic component and passes through the thin membrane. A first portion of the sealed housing is shaped to fit a space defined by non-vacuumed scanning electron microscope components that are maintained in a non-vacuum environment.

45 Claims, 13 Drawing Sheets

U.S. PATENT DOCUMENTS

| | | | |
|---|---|---|---|
| 6,156,435 A * | 12/2000 | Gleason et al. | 428/422 |
| 6,188,074 B1 * | 2/2001 | Satoh et al. | 250/492.22 |
| 6,410,923 B1 | 6/2002 | Crewe | |
| 6,452,177 B1 * | 9/2002 | Feldman et al. | 850/9 |
| 6,610,980 B2 | 8/2003 | Veneklasen et al. | |
| 6,992,300 B2 * | 1/2006 | Moses et al. | 250/440.11 |
| 7,220,963 B2 | 5/2007 | Gross | |
| 7,586,093 B2 * | 9/2009 | Feuerbaum | 250/311 |
| 8,164,057 B2 * | 4/2012 | Shachal | 250/307 |
| 2003/0178576 A1 | 9/2003 | Pan et al. | |
| 2004/0046120 A1 | 3/2004 | Moses et al. | |
| 2004/0188611 A1 | 9/2004 | Takeuchi et al. | |
| 2006/0012785 A1 | 1/2006 | Funk et al. | |
| 2006/0033038 A1 | 2/2006 | Moses et al. | |
| 2006/0169910 A1 | 8/2006 | Frosien et al. | |
| 2007/0210253 A1 | 9/2007 | Behar et al. | |
| 2010/0140470 A1 * | 6/2010 | Shachal | 250/307 |
| 2011/0168889 A1 * | 7/2011 | Shachal et al. | 250/307 |
| 2011/0210247 A1 * | 9/2011 | Shachal et al. | 250/307 |
| 2012/0241608 A1 * | 9/2012 | Shachal | 250/307 |

FOREIGN PATENT DOCUMENTS

| | | |
|---|---|---|
| WO | 2008/050321 A2 | 5/2008 |
| WO | WO 2008/050321 | 5/2008 |
| WO | WO 2010/001399 | 1/2010 |
| WO | WO 2010/035265 | 4/2010 |

OTHER PUBLICATIONS

An International Search Report dated Jan. 26, 2010, which issued during the prosecution of Applicant's PCT/IL09/00926.

An International Search Report dated Nov. 18, 2009, which issued during the prosecution of Applicant's PCT/IL09/00660.

A Supplementary European Search Report dated Mar. 6, 2012 which issued during the prosecution of Applicant's European App No. 09815770, In English.

An Office Action dated Feb. 15, 2013, which issued during the prosecution of U.S. Appl. No. 13/449,392, In English.

* cited by examiner

300

VACUUMED DEVICE AND A SCANNING ELECTRON MICROSCOPE

RELATED APPLICATIONS

This application is a National Stage of International Application No. PCT/IL2009/000926 filed Sep. 24, 2009, claiming priority based on U.S. Provisional Patent Application No. 61/100,735, filed Sep. 28, 2008, the contents of all of which are incorporated herein by reference in their entirety.

BACKGROUND OF THE INVENTION

High resolution microscopy is used in research and development, quality assurance and production in diverse fields such as material science, life science, the semiconductor industry and the food industry.

Optical microscopy dating back to the seventeenth century, has reached a brick wall, defined by the wavelength of deep Ultra Violet photons, giving a finest resolution of about 80 nm.

The popularity of optical microscopy stems from its relative low price, ease of use and the variety of imaging environment all translated to availability.

A scanning electron microscope (SEM) provides a much finer resolution (down to a few nanometers) but in order to achieve that high resolution the inspected object should be placed in a vacuum environment and be scanned by an electron beam.

The electron beam is generated by an electron beam source that may include an emitter. The emitter has a relatively short lifetime and has to be replaced multiple times during the lifespan of the SEM. A W emitter will typically work several hundred hours, a $LaB_6$ emitter over 1000 hours and a Schottky emitter typically will operate over 10000 hours.

The electron beam may pass through one or more apertures of the SEM. A typical aperture has a limited lifespan and should be replaced from time to time.

The maintenance of the SEM involves replacing the emitter, the aperture as well as other components of the SEM. The replacement process is time consuming and also requires designing the SEM to be large enough to allow the disassembly of these components. The SEM has to be equipped with vacuum ports for disassembly. In addition, a replacement of such a component is followed by an evacuation of the chamber of the SEM from atmospheric pressure to high vacuum and may also require heating the electron source chamber (so-called baking process).

The chamber of the SEM is large and is usually connected to one or more high throughput vacuum pumps.

Even after the vacuum level is reached there are still several steps before having the system fully operational: alignment of the emitter and finding its optimal working point in term of filament current and potential. This process is time consuming and requires expertise. For example, the entire cycle of replacing a Schottky emitter and bringing the system to full operational mode can take more than 12 hours.

There is a growing need to provide a SEM that is characterized by a fast replacement scheme.

SUMMARY OF THE INVENTION

A vacuumed device that includes: a sealed housing, an electron beam source, an electron optic component, a thin membrane, and a detector; wherein the thin membrane seals an aperture of the sealed housing; wherein the sealed housing defines a vacuumed space in which vacuum is maintained; wherein the electron beam source is configured to generate an electron beam that propagates within the vacuumed space, interacts with the electron optic component and passes through the thin membrane; wherein a first portion of the sealed housing is shaped to fit a space defined by non-vacuumed scanning electron microscope components that are maintained in a non-vacuum environment.

An apparatus that includes the vacuumed device and a vacuum pump coupled to the vacuumed device.

A scanning electron microscope that includes: non-vacuumed scanning electron microscope components that are maintained in a non-vacuum environment; wherein the non-vacuumed scanning electron microscope components define a space; a vacuumed device that includes: a sealed housing, an electron beam source, an electron optic component, a thin membrane, and a detector; wherein the thin membrane seals an aperture of the sealed housing; wherein the sealed housing defines a vacuumed space in which vacuum is maintained; wherein the electron beam source is configured to generate an electron beam that propagates within the vacuumed space, interacts with the electron optic component and passes through the thin membrane; and wherein a first portion of the sealed housing is shaped to fit the space.

A method for maintaining a scanning electron microscope, the method includes: replacing a first vacuumed device by a second vacuumed device, wherein the replacing comprises connecting the second vacuumed device to the non-vacuumed component of the scanning electron microscope in a releasable manner.

A method for imaging an object, the method includes: generating an electron beam by an electron beam source of a replaceable vacuumed device; directing the electron beam to propagate through a vacuumed space and towards an aperture of a sealed housing of the replaceable vacuumed device; wherein the aperture is sealed by a membrane that withstands a pressure difference between the vacuumed space and a non-vacuumed environment in which the object is positioned; detecting particles by a detector of the vacuumed device, wherein the detected particles are generated in response to an interaction of the electron beam and the object; and outputting detection signals from the detector; wherein the detection signals once processed contribute to a generation of an image of at least a portion of the object; wherein during the stages of generating and detecting a first portion of the vacuumed device is placed within an space defined by at least one non-vacuumed component of a scanning electron microscope, and wherein the first portion of the vacuumed device is shaped to fit the space.

DETAILED DESCRIPTION OF THE INVENTION

Figure 1:
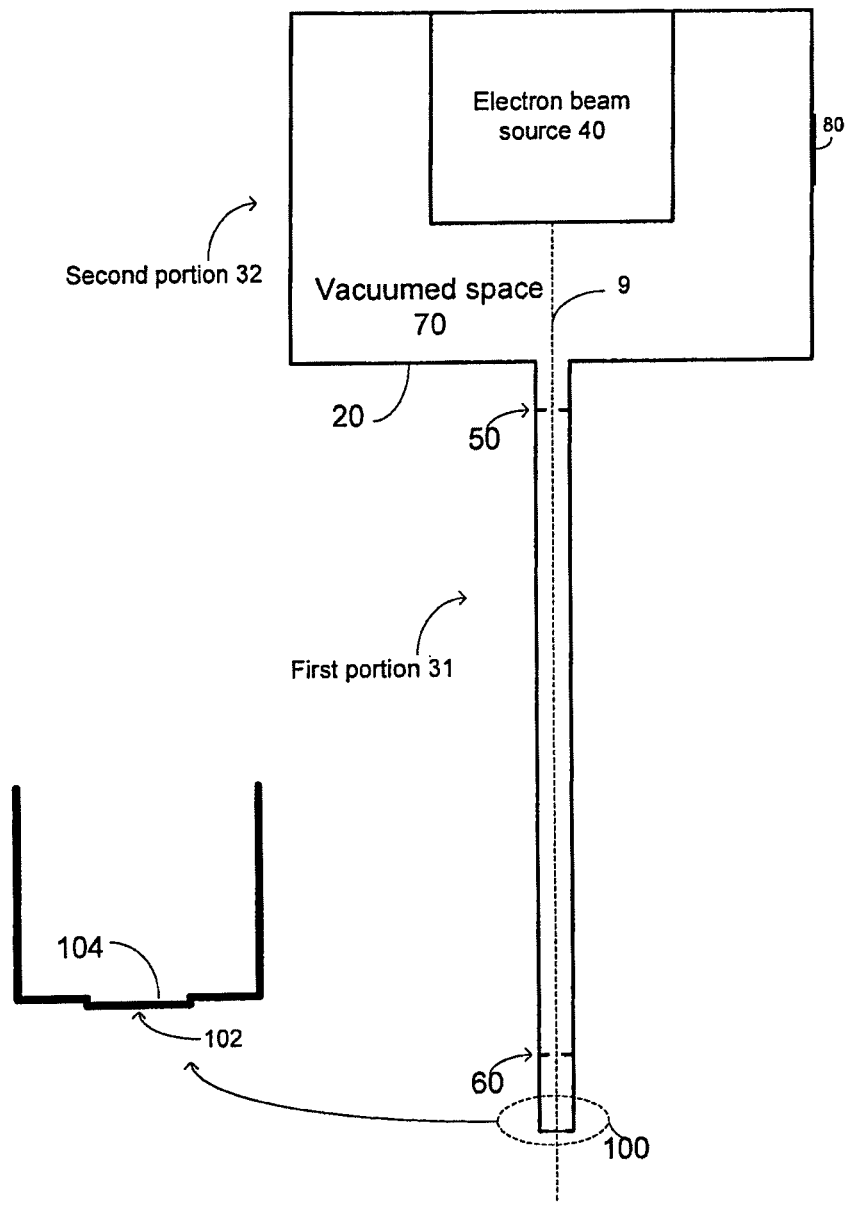
FIG. 1 is a schematic cross section of a vacuumed device according to an embodiment of the invention.

According to an embodiment of the invention a SEM, an apparatus and a vacuumed device are provided. The SEM may include the apparatus. The apparatus may include the vacuumed device. The vacuumed device is also referred to as a replaceable vacuumed device.

According to various embodiments of the invention the SEM obtains images of an object that is located in a non-vacuumed environment. The SEM includes one or more non-vacuumed components and the vacuumed device (or the apparatus). A non-vacuumed component is a component that is not located in a vacuumed environment.

Vacuum is maintained in the vacuumed device but conveniently is not maintained in other portions of the SEM. If the vacuumed device malfunctions the entire vacuumed device is replaced. The vacuumed device is relatively small and the vacuum within the vacuumed device can be maintained quite easily by using a low throughput vacuum pump.

The vacuumed device is replaceable by its entirety, it is sealed and it may include all the components that should be maintained in vacuum. This simplified the maintenance of the SEM. Instead of having a skilled person maintaining and replacing emitters or apertures, the entire vacuumed device is easily replaced.

Additionally or alternatively, because the replacement is not followed by a time consuming evacuation stage or by a vapor removal stage (such as a baking stage) the replacement process is very quick and has a minimal impact on the throughput of the SEM.

The vacuumed device can be relatively small, as it does not need to include access ports for replacing the electron beam source or the aperture and as the number of interfaces to external components (such as a chamber, a valve, a vacuum pump) is reduced to minimum.

The vacuumed device may include a sealed housing that may include a very small first portion and a slightly larger second portion. Both portions may be relatively small and of a very small footprint.

Conveniently, the sealed housing has a first portion that is shaped to fit a space defined by one or more non-vacuumed components of the SEM. This space can be defined by a housing (so called—non-vacuumed housing) or by another mechanical interface that may also surround (or at least partially surround) other non-vacuumed components such as coils, lenses and the like.

According to an embodiment of the invention the vacuumed device (and especially a first portion of the sealed housing) may be tightly fitted into the space defined by one or more non-vacuumed components of the SEM. The first portion can fit with a mechanical tolerance of tens of microns (for example about 50 microns) in at least one of the lateral and horizontal dimensions.

According to an embodiment of the invention the SEM may include an aligner that can move the vacuumed device in relation to the space over one or two axes. The aligner can be used even if the vacuumed device is tightly fitted. The aligner can include one or more screws and one more screw receptacles.

It is noted that at least a portion of a possible misalignment between the vacuumed device and a non-vacuumed component of the SEM can be compensated by introducing electromagnetic fields by a non-vacuumed component such as a coil.

One or more non-vacuumed components may surround (or at least partially surround) the vacuumed device (or at least the first portion of the sealed housing of the vacuumed device) and may affect the propagation of an electron beam within the vacuumed device. A non-limiting example of a non-vacuumed component that may affect the trajectory of the electron beam and compensate for possible misalignments is a deflecting coil.

The vacuumed device includes an electron beam source such as an emitter that may be pre-aligned, preconditioned and set to its optimal operating parameters. The replacement process does not involve setting the emitter, re-aligning it with other components of the vacuumed device or setting the optimal conditions as they were already set during the manufacturing process of the vacuumed device.

Conveniently, all the vacuumed components of the SEM are arranged in the vacuumed device. This feature simplifies the manufacturing of the vacuumed device and opens the opportunity to use different materials and manufacturing technologies as used today moving to mass production with a significant implication on the product cost.

The vacuumed device is replaceable and may include a sealed housing, an electron beam source, an electron optic component, a thin membrane, and a detector. The thin membrane seals an aperture of the sealed housing. The sealed housing defines a vacuumed space in which vacuum is maintained.

The electron beam source is configured to generate an electron beam that propagates within the vacuumed space, interacts with the electron optic component and passes through the thin membrane. A first portion of the sealed housing is shaped to fit a space defined by non-vacuumed scanning electron microscope components that are maintained in a non-vacuum environment.

The vacuumed device may include multiple detectors, multiple electron optic components or a combination thereof. For simplicity of explanation most of the following description refers to vacuumed device that includes a single aperture and a single detector.

The sealed housing may include multiple apertures through the electron beam may pass. The one or more apertures may be sealed by one or more membranes. The membranes may be thin and even very thin—they may have a thickness of few nanometers and even less. Each membrane is transparent or semi-transparent to the electron beam and also holds the pressure difference between a non-vacuumed environment and the vacuumed environment maintained within the sealed housing.

If the vacuumed device has multiple membranes than these membranes may be arranged to form one or more array. Different membranes may differ from each other by size, thickness or both.

The electron beam may be directed to pass through a membrane by deflecting the electron beam towards the membrane, by introducing a mechanical movement between the membrane and the electron beam source or a combination thereof. For example—the membrane can be connected to a frame that is connected to (or placed on) a moving part (such as a bellow) that enables to move the membrane in relation to optical axis of the electron beam.

The frame of the membrane can also be electrically floating relative to the vacuum device allowing to measure (for example by connecting the frame to a pico-Amperemeter) the electrical current generated by the electrons impinging the frame. A bias can be provided to the frame to enhance the detection.

The electron optic components of the vacuumed device may include apertures, grids, lenses, electrodes for accelerating or decelerating the electron beam, beam splitters and the like. An electron optic component may be any component that affects a trajectory of the electron beam, a shape of the electron beam, a focus of the electron beam and the like.

The SEM may include one or more electron optic components that are maintained in a non-vacuumed environment and those are referred to as non-vacuumed components.

The sealed housing may includes a single opening that is shaped to fit an output of a vacuum pump that is configured to maintain the vacuum in the vacuumed space. The vacuum pump may be an ion pump.

The first portion of the sealed housing may have a cylindrical shape—it may be shaped as a long and narrow tube. The first portion may have a millimetric diameter—its diameter may range between few millimeters and few tens of millimeters.

It is noted that the cross section of the first portion may be larger than few tens of millimeters but smaller dimensions may result in a smaller vacuumed space that is easier to maintain in vacuum—a lower throughput vacuum pump can be used to maintain the vacuum. For example—the diameter of the first portion may range between 3 and 15 millimeters.

According to various embodiments of the invention the vacuumed device also has a second portion. The second portion may be larger than the first portion—it may have a larger cross section. It may have a cylindrical shape but this is not necessarily so.

The larger second portion provides connectivity to a vacuum pump and also may provide connectivity to one or more non-vacuumed components of the SEM. The second portion is adapted to be connected in a releasable manner to the one or more non-vacuumed components of the SEM (such as a non-vacuumed housing) by using screws or other interfacing or guiding components.

The second portion may is shaped to fit an aligner of the SEM that is configured to align the vacuumed device and at least one non-vacuumed component of the scanning electron microscope. The aligner can provide alignment along two or three axes.

According to an embodiment of the invention the sealed housing has only a single opening (in addition to the aperture that is sealed by a membrane) and this opening provides an interface to a vacuum pump.

According to an embodiment of the invention the sealed housing is a valve-less housing—it does not include any valves. According to another embodiment of the invention the sealed housing may include one or more valves that may be used to control the flow of particles from (or to) the vacuum pump.

According to an embodiment of the invention the sealed housing defines a vacuumed space that is very small—its volume does not exceed few hundred cubic centimeters.

As mentioned above the vacuumed device (or at least a first portion of a sealed housing) is shaped to fit a space defined by one or more non-vacuumed components of the SEM.

According to an embodiment of the invention the vacuumed device (or at least the first portion) is shaped such as to be tightly fitted into the space. Thus—after being placed in the space there is an insignificant space between the first portion and an interfacing non-vacuumed component such as the non-vacuumed housing.

According to an embodiment of the invention the sealed housing includes at least one (externally accessible) connector. The connector may facilitate at least one of the following: (i) a provision of power to a detector of the vacuumed device, (ii) a provision of control or configuration signals to the detector of the vacuumed device, (iii) a reception of detection signals or processed detection signals from the detector of the vacuumed device, (iv) a reception of the detected current from the membrane frame, (v) a provision of bias to the membrane frame.

The vacuumed device may provide connectivity (via one or more pin, cable, connector and the like) to the electron beam source, extraction and high voltage components (or electrodes) of the electron beam source; the membrane and to a vacuum pump the may be connected to the vacuumed device.

It is noted that each detector of the vacuumed device may have its own detector connector, that multiple detectors can share a connector and that a single detector can be connected to more than a single detector connector.

According to an embodiment of the invention the vacuumed device defines a vacuumed space that is too small to include within it an alignment coil, a condenser len, an astigmatism beam shift coil, a scanning coil or an objective lens. The vacuum in that vacuumed space can be maintained by a low throughput vacuum pump.

The vacuumed device may include one or more detectors that may differ from each other or similar to each other. A detector of the vacuumed device may detect electrons, photons, X-ray radiation and the like. An electron detector may be a scintillator based or a solid state detector. An X-ray detector may be a Si drift detector. A vacuumed detector may facilitate energy dispersive spectroscopy and the like.

The electron source of the vacuumed device may be made of various materials differing in their brightness and the vacuum level needs for example a W emitter, $LaB_6$ emitter, or a field emitter.

Conveniently, during the manufacturing process (especially during the assembly stage) of the vacuumed device it can be baked in order to reduce or even get rid of vapors.

The vacuumed device can be made from different materials for example glass, Aluminum or stainless steel.

The vacuumed device may include an aperture. The aperture is manufactured and assembled in a controlled and clean environment and is then positioned within the sealed housing without being exposed to contaminations. This may contribute to the image quality obtained by the SEM and may lengthen the lifespan of the aperture.

According to an embodiment of the invention the vacuumed device can have a T-shape cross section as each of the first and second portions may have a cylindrical shape—wherein the second portion is wider than the first portion and both portions are coaxial.

According to an embodiment of the invention an apparatus is provided. The apparatus includes the vacuumed device and a vacuum pump that is connected to the vacuumed device. The vacuum pump is configured to maintain the vacuum within the vacuumed device. The vacuum pump may be characterized by a low throughput. Its throughput may range between 2 and 3 liters per second. The vacuum pump may be an ion pump, a battery powered vacuum pump or a battery operated ion pump The apparatus may include an aligner that is connected to the vacuumed device. The aligner may be configured to align the vacuumed device and at least one non-vacuumed component of a SEM. It is noted that the aligner may not be included in the apparatus but may only be connected to the apparatus once the latter is connected to the SEM. Yet according to an embodiment of the invention one or more components of the aligner can belong to the apparatus and one or more other components of the aligner can be regarded as a non-vacuumed component (or components) of the SEM.

According to various embodiments of the invention a SEM is provided. The SEM includes non-vacuumed components that are maintained in a non-vacuum environment and also includes a vacuumed device.

The SEM may include an apparatus as illustrated above and one or more non-vacuumed components such as but not limited to an alignment coil, a condenser len, an astigmatism beam shift coil, a scanning coil or an objective lens.

The SEM may be configured to maintain vacuum only in the vacuumed space.

The SEM may include a stage for supporting an object in a non-vacuumed environment. The stage can move the object along one, two or three axes.

According to an embodiment of the invention the SEM may include a gas introducer for introducing different gas mixtures to the non-vacuumed environment to enhance detection and contrast. The gas introducer may introduce an enriched mixture of He or Nitrogen but other gas mixtures may be provided. The gas mixture can be provided in proximity to the object but this is not necessarily so.

According to an embodiment of the invention the SEM can include a chamber, a cell or a compartment (collectively referred to as chamber) in which the object may be positions. The chamber includes a window that allows the object to be imaged. The chamber can include or be connected to one or more controllers that may be configured to control at least one parameter of the non-vacuumed environment within the chamber. For example, the controller can control the gas composition, the temperature, the pressure, the humidity within the chamber or a combination thereof. The temperature can be controlled by a controller that includes heating elements, cooling elements and the like. The gas composition can be controlled by a controller that includes gas filters, gas introducers and the like.

According to an embodiment of the invention the SEM includes a z-stage that is configured to change an elevation of the vacuumed device in relation to the stage of the scanning electron microscope. The z-stage may have a travel range of few hundred of microns but other travel rages may be provided. The z-stage may allow a positioning of the aperture of the sealed housing to a desired distance from the object. This may optimize the image acquisition conditions of the SEM and simplify the design process of the SEM as it is easier to design a SEM if the distance between the aperture and the object may be controlled—especially when the objects can be of different heights.

According to an embodiment of the invention the SEM includes at least one non-vacuumed detector—at least one detector that is not positioned in a vacuumed environment. A non-vacuumed detector may detect electrons, X-ray photons visible or infra red (IR) photons. A detector can detect scattered electrons, transmitted electrons or a combination thereof and may enable to generate a scanning transmission image.

FIG. 1 is a schematic cross section of vacuumed device 30 according to an embodiment of the invention.

Vacuumed device 30 includes sealed housing 20, electron beam source 40, detector 60, aperture 50 and connector 80. Sealed housing 20 includes first portion 31 and second portion 32.

Sealed housing 20 defines vacuumed space 70 in which electron beam 9 propagates. Sealed housing 20 has an aperture 104 that is sealed by membrane 102. Balloon 100 illustrates in greater details aperture 104 and membrane 102.

Dashed line 9 illustrates the path of electron beam 9 and can define its optical axis.

Figure 2:
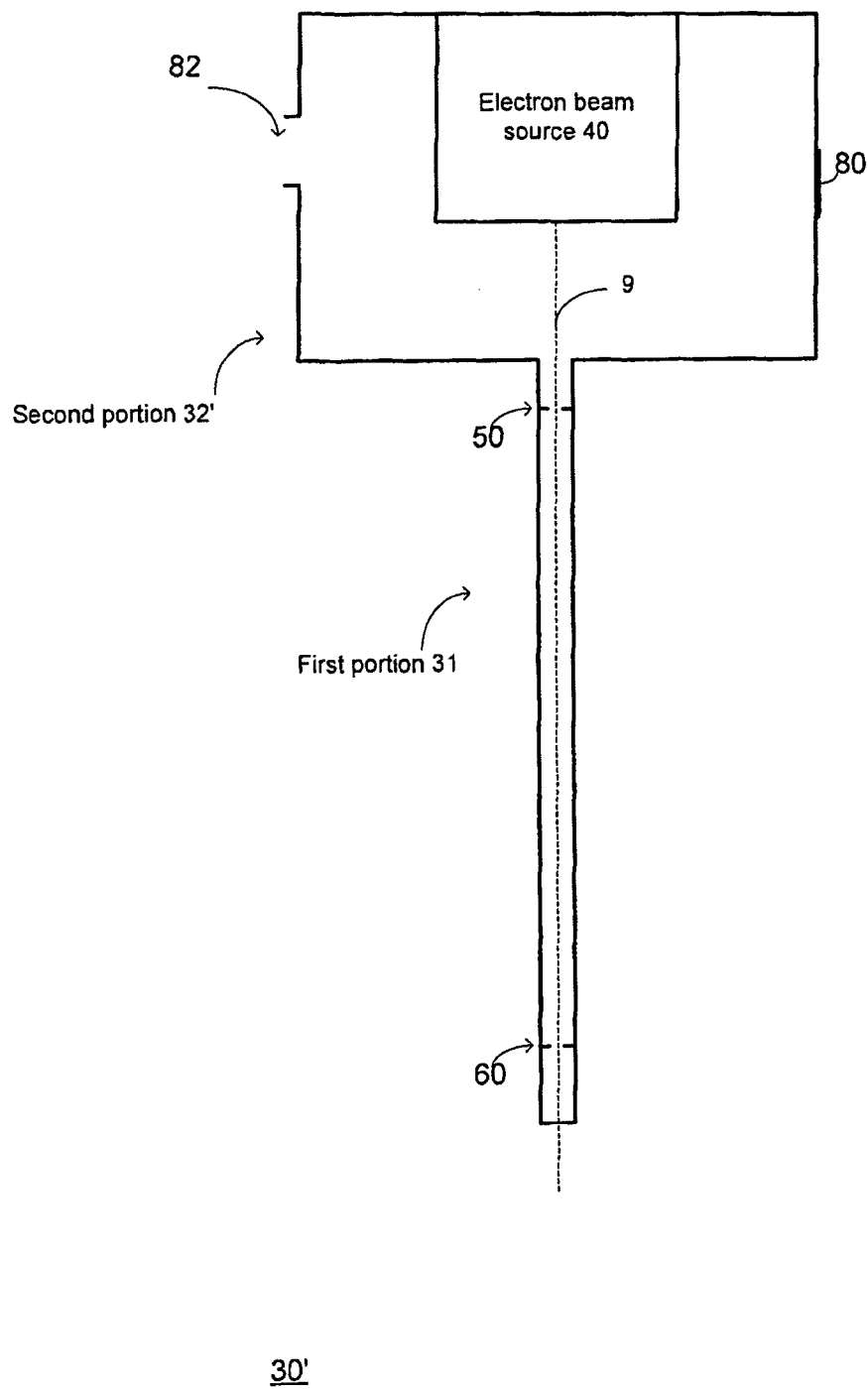
FIG. 2 is a schematic cross section of a vacuumed device according to an embodiment of the invention.

FIG. 2 is a schematic cross section of vacuumed device 30' according to an embodiment of the invention.

While vacuumed device 30 of FIG. 1 does not include any opening (except aperture 104), vacuumed device 30' includes an opening 82 that is used as an interface to a vacuum pump (not shown). Once the vacuum pump is connected to the opening 82 the sealed housing 80 remains sealed. It is noted the opening 82 can be preceded by a valve (not shown).

Figure 3:
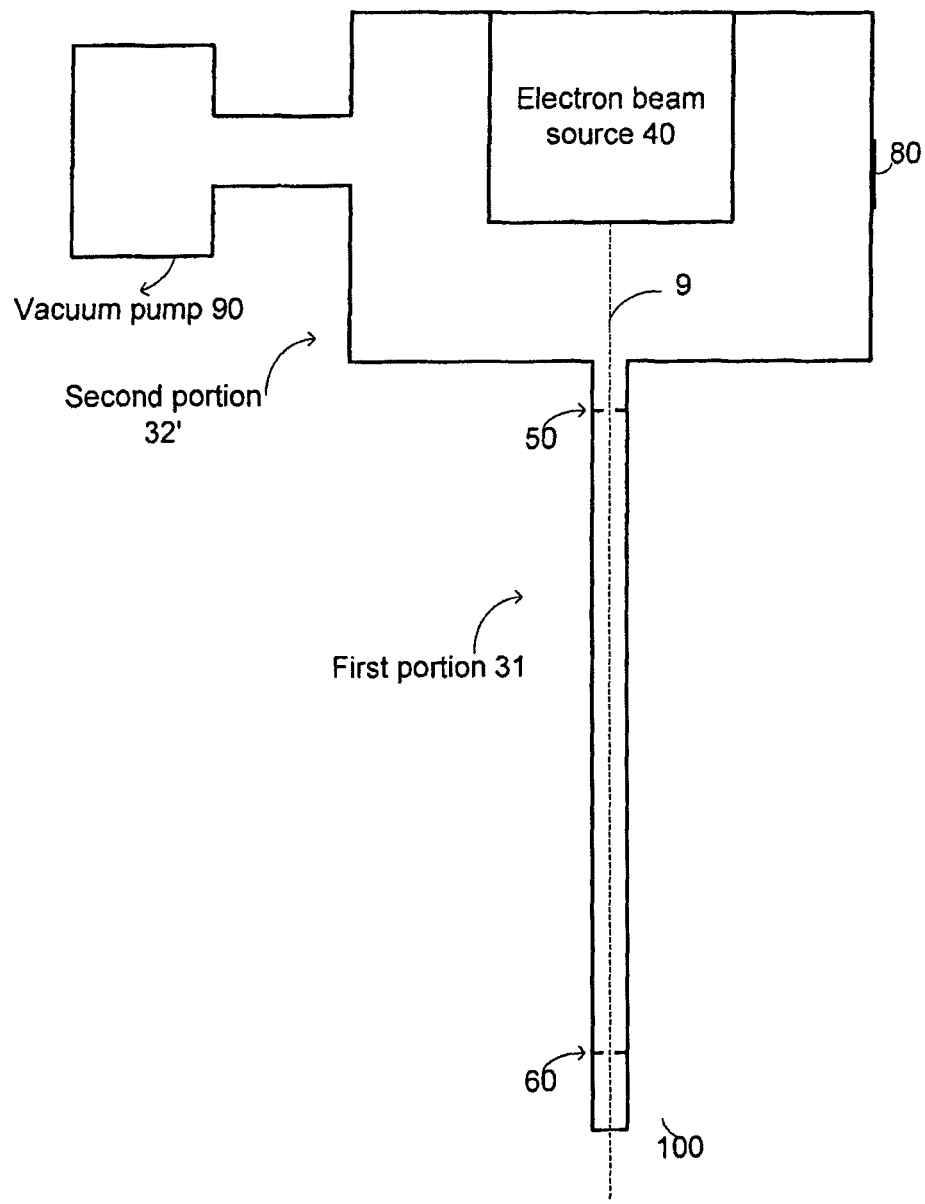
FIG. 3 is a schematic cross section of an apparatus according to an embodiment of the invention.

FIG. 3 is a schematic cross section of apparatus 20 according to an embodiment of the invention. Apparatus 20 includes vacuumed device 30' and vacuum pump 90.

Figure 4:
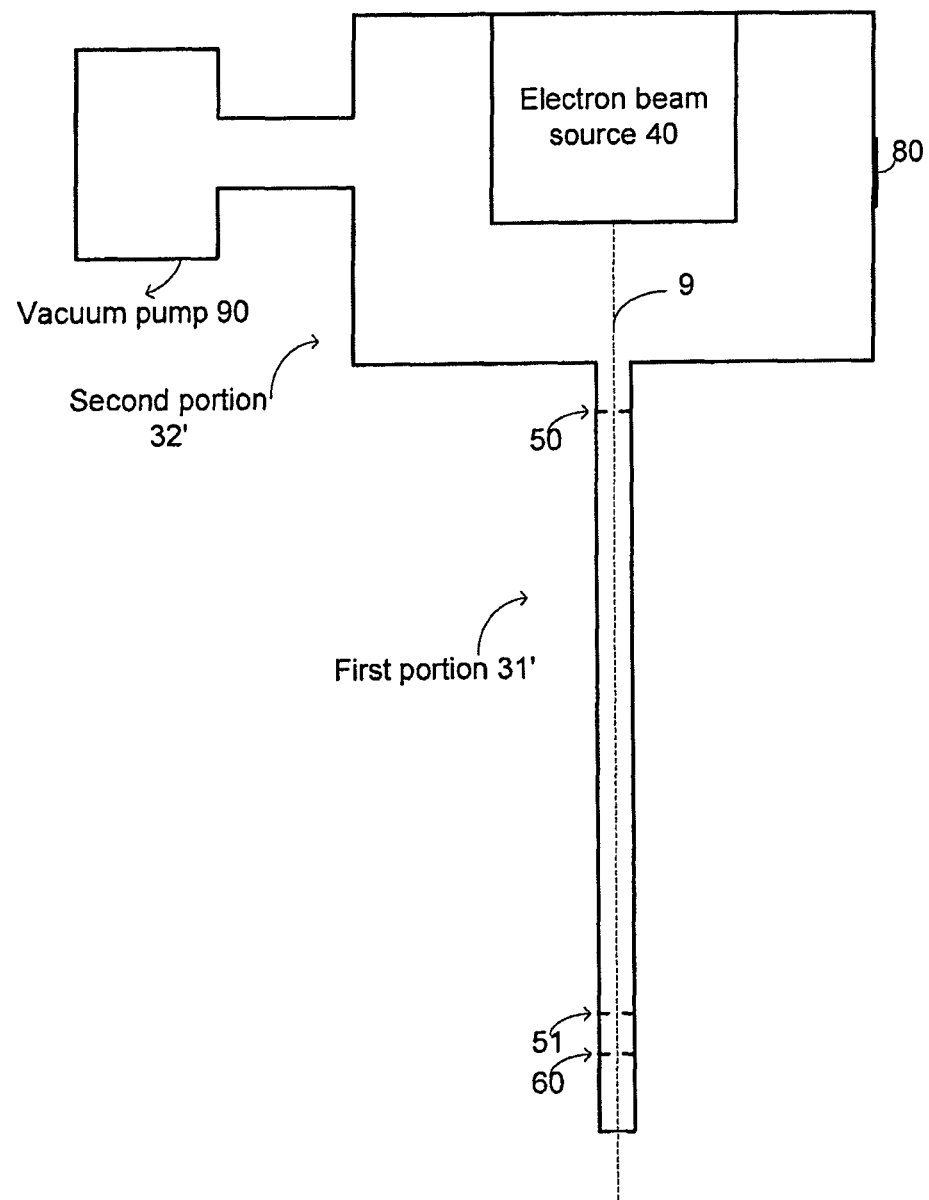
FIG. 4 is a schematic cross section of an apparatus according to an embodiment of the invention.

FIG. 4 is a schematic cross section of apparatus 20' according to an embodiment of the invention. Apparatus 20' includes vacuum pump 90 and a vacuumed device that includes two apertures 50 and 51. These two apertures 50 and 51 are included in first portion 31' of a sealed housing 20.

Figure 5:
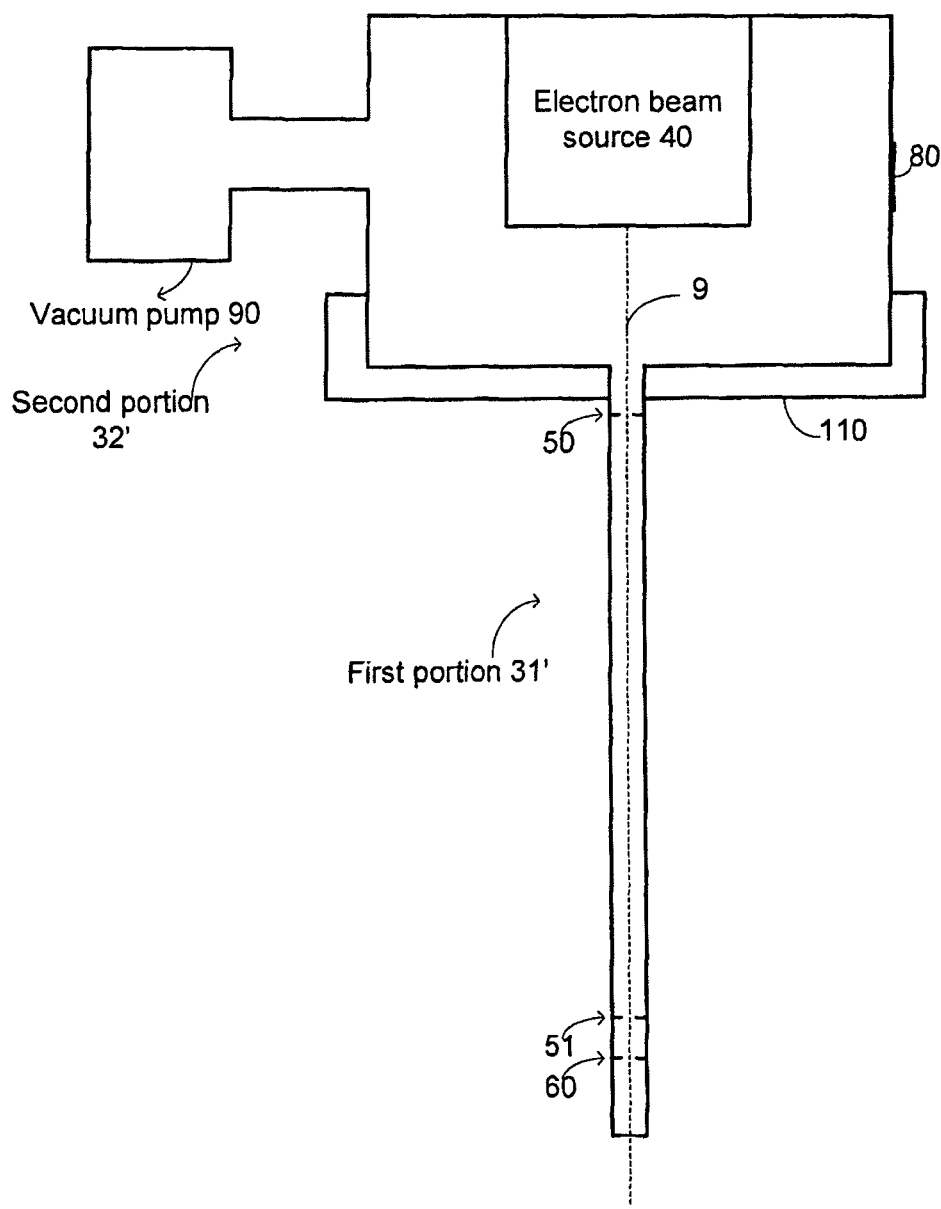
FIG. 5 is a schematic cross section of an apparatus according to an embodiment of the invention.

FIG. 5 is a schematic cross section of apparatus 20" according to an embodiment of the invention. Apparatus 20" differs from apparatus 20' by including aligner 110. Aligner 110 is illustrated as being connected to the lower surface and side surfaces of second portion 32'.

Figure 6:
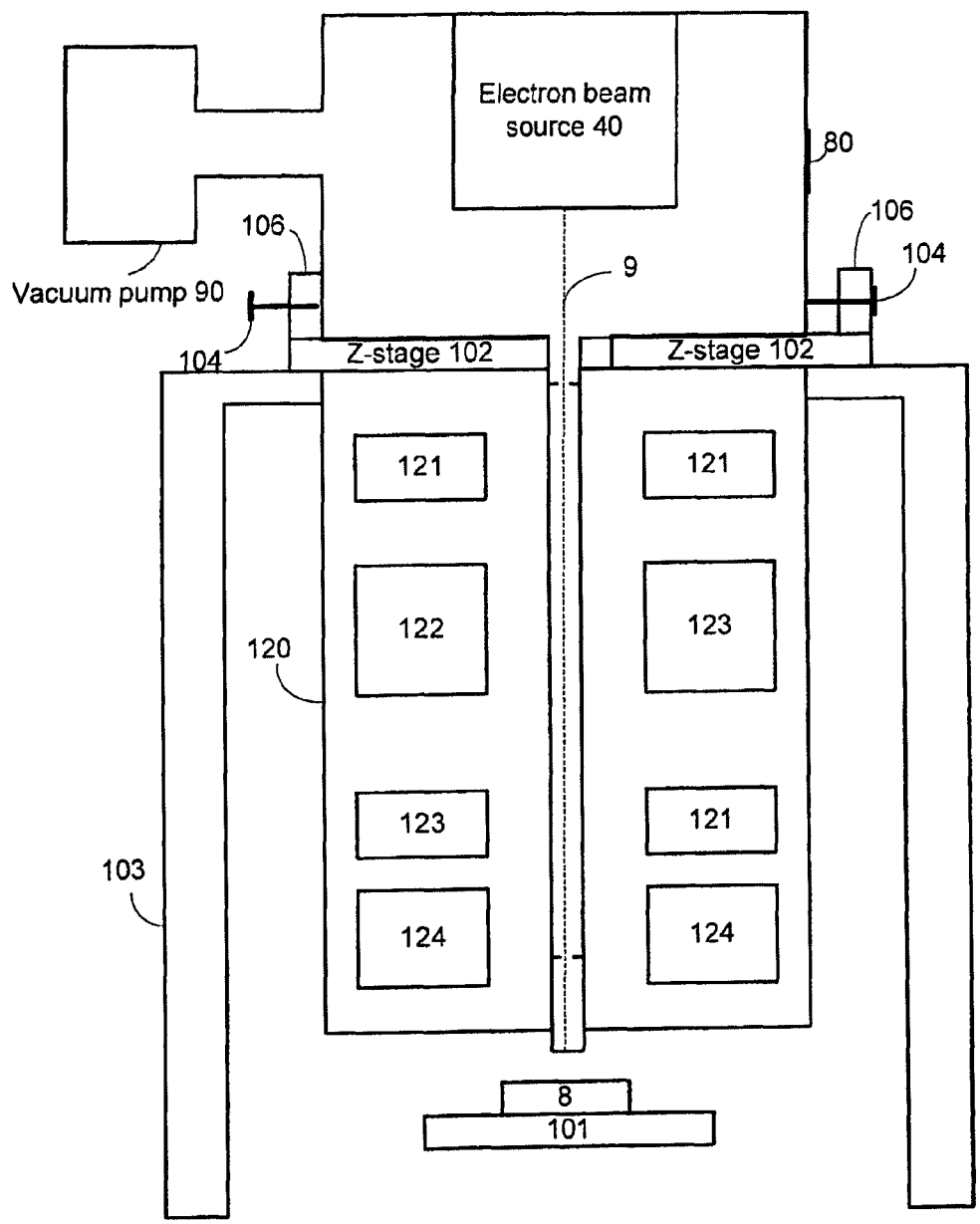
FIG. 6 is a schematic cross section of a SEM according to an embodiment of the invention.

FIG. 6 is a schematic cross section of SEM 10 according to an embodiment of the invention.

SEM 10 includes apparatus 20 and non-vacuumed components such as stage 101, screws 104, screw receptacles 106, z-stage 102, non-vacuumed housing 120, coils and lenses 121-124 and supporting element 103. FIG. 6 also illustrates object 8 that is supported by stage 101. Object 8 is located in a non-vacuumed environment.

Apparatus 20 and especially first portion 31 of the vacuumed device of the apparatus, fits into a space defined by non-vacuumed housing 120.

Non-vacuumed housing 120 also surrounds coils and lenses 121-124. These coils and lenses include gun alignment coil 121, condenser lens 122, astigmatism beam shift and scanning coils 123 and objective lens 124.

Non-vacuumed housing 120 includes an inner wall that defines the space that partially surrounds first portion and also includes additional walls that define a space in which coils and lenses 121-124 are located.

Z-stage 102 is located between non-vacuumed housing 120 and the second portion.

Screws 104 are used to move apparatus 20 in relation to non-vacuumed housing 120 along an imaginary horizontal axis that is parallel to the page on which FIG. 6 is drawn. One or more additional screws (not shown) may be used to move apparatus 20 in relation to non-vacuumed housing 120 along another imaginary horizontal axis that is perpendicular to the page on which FIG. 6 is drawn.

Screw receptacles 106 may also be used as stoppers that limit the relative motion between apparatus 20 and non-vacuumed housing 120.

SEM 10 may include an image processor (not shown), memory unit and other digital components that convert detection signals from detector 60 to images of object 8. The image processing can also be implemented by a stand alone or a remote image processor.

Figure 7:
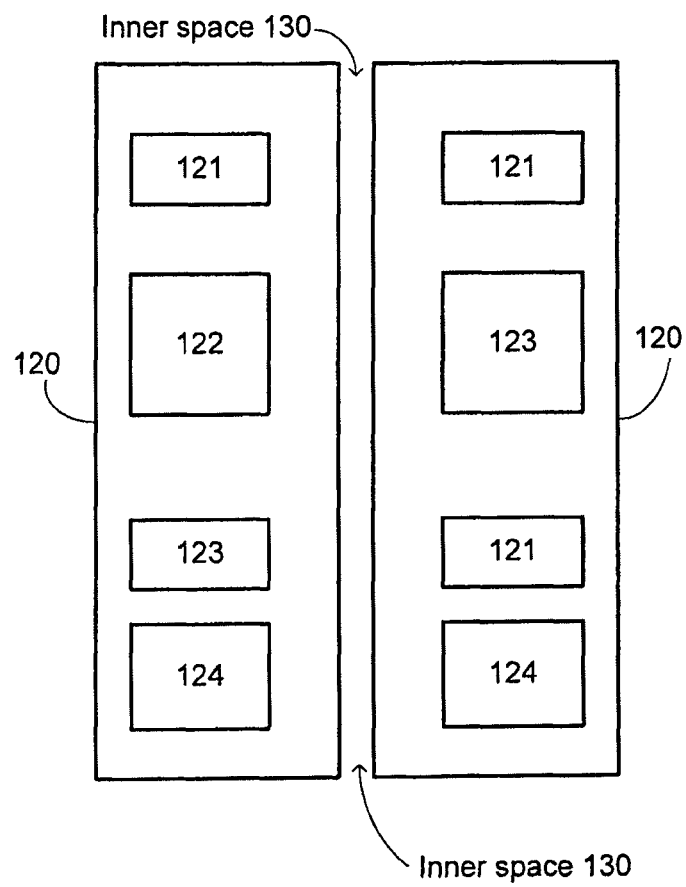
FIG. 7 is a schematic cross section of a non-vacuumed housing and of coils and lenses according to an embodiment of the invention.

FIG. 7 is a schematic cross section of non-vacuumed housing 120 and of coils and lenses 121-124 according to an embodiment of the invention.

FIG. 7 also illustrates the space 130 defined by non-vacuumed housing 120.

Figure 10:
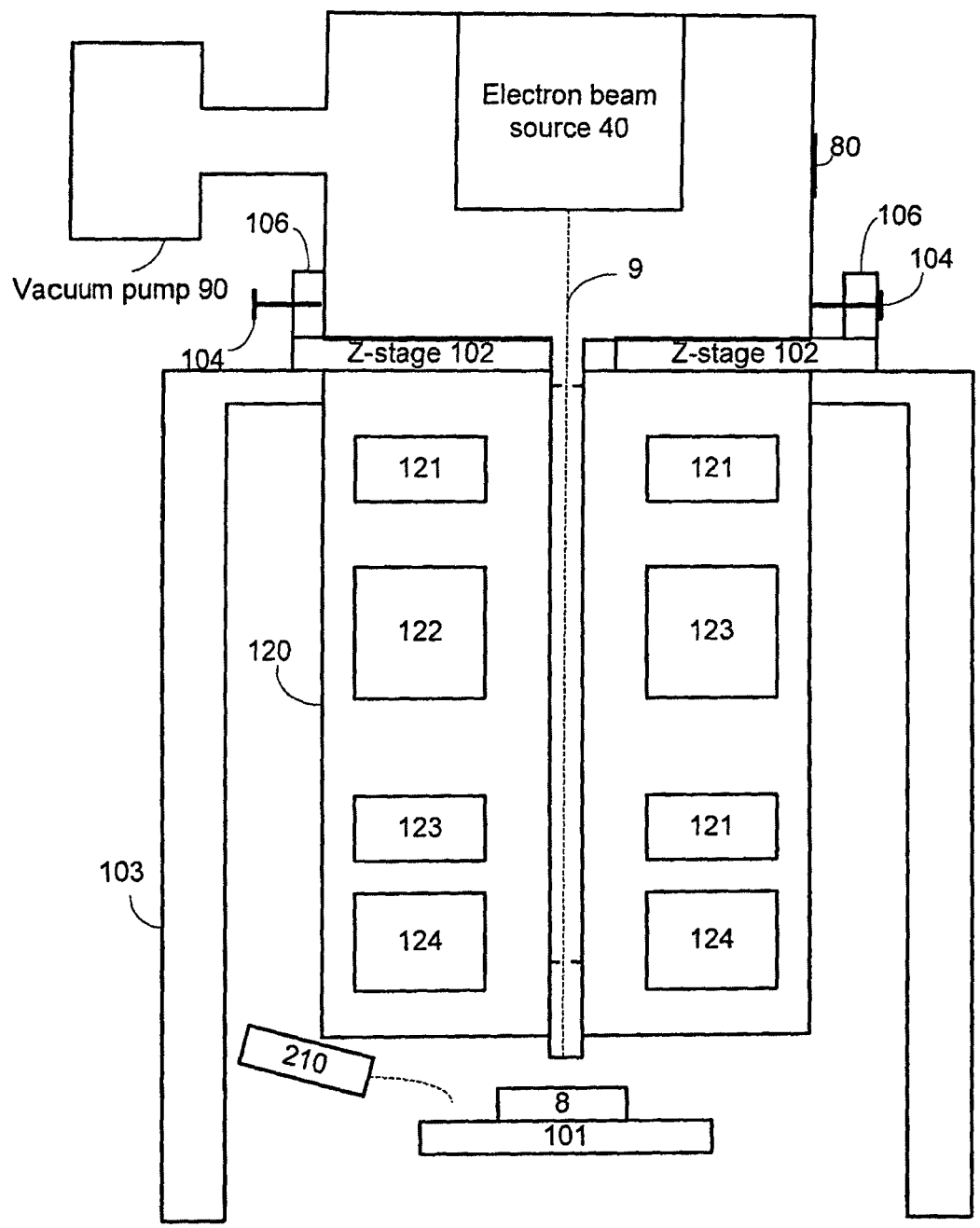
FIG. 10 is a schematic cross section of a SEM according to an embodiment of the invention.

FIG. 10 is a schematic cross section of SEM 10' according to an embodiment of the invention.

SEM 10' differs from SEM 10 by including inducer 210 that may induce gas, a chemical, a gas mixture and the like to the non-vacuumed environment in which object 8 is located. The dashed line that is connected to inducer 210 schematically illustrates a gas mixture that is outputted from the inducer.

Figure 11:
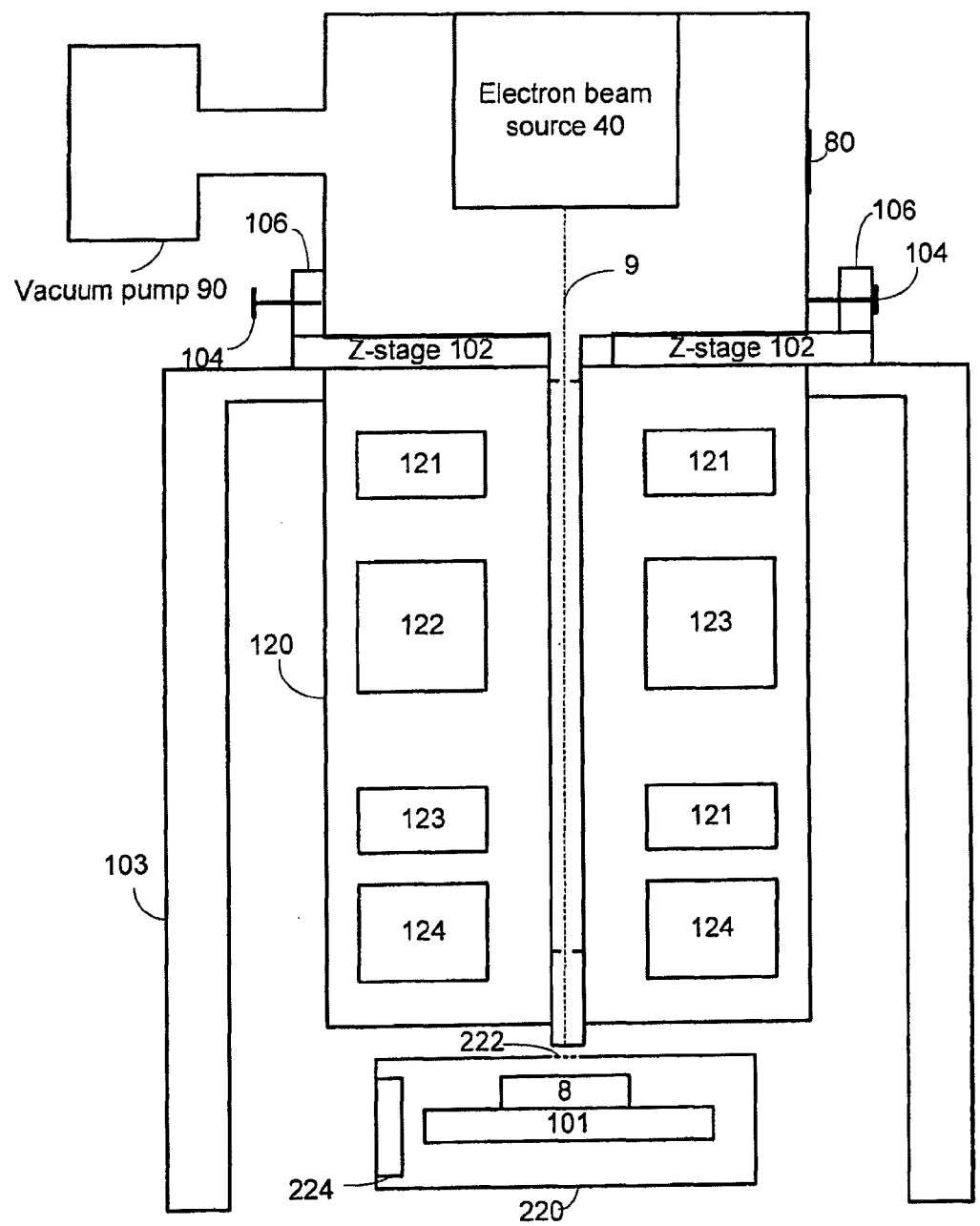
FIG. 11 is a schematic cross section of a SEM according to an embodiment of the invention.

FIG. 11 is a schematic cross section of SEM 10" according to an embodiment of the invention.

SEM 10" differs from SEM 10 by including chamber 220, controller 224 and window 222 of chamber 220. The window 222 is transparent or semi-transparent to the electron beam and to particles that should be detected by detector 60. Controller 224 may affect or control at least one parameter of the non-vacuumed environment within chamber 220.

Figure 12:
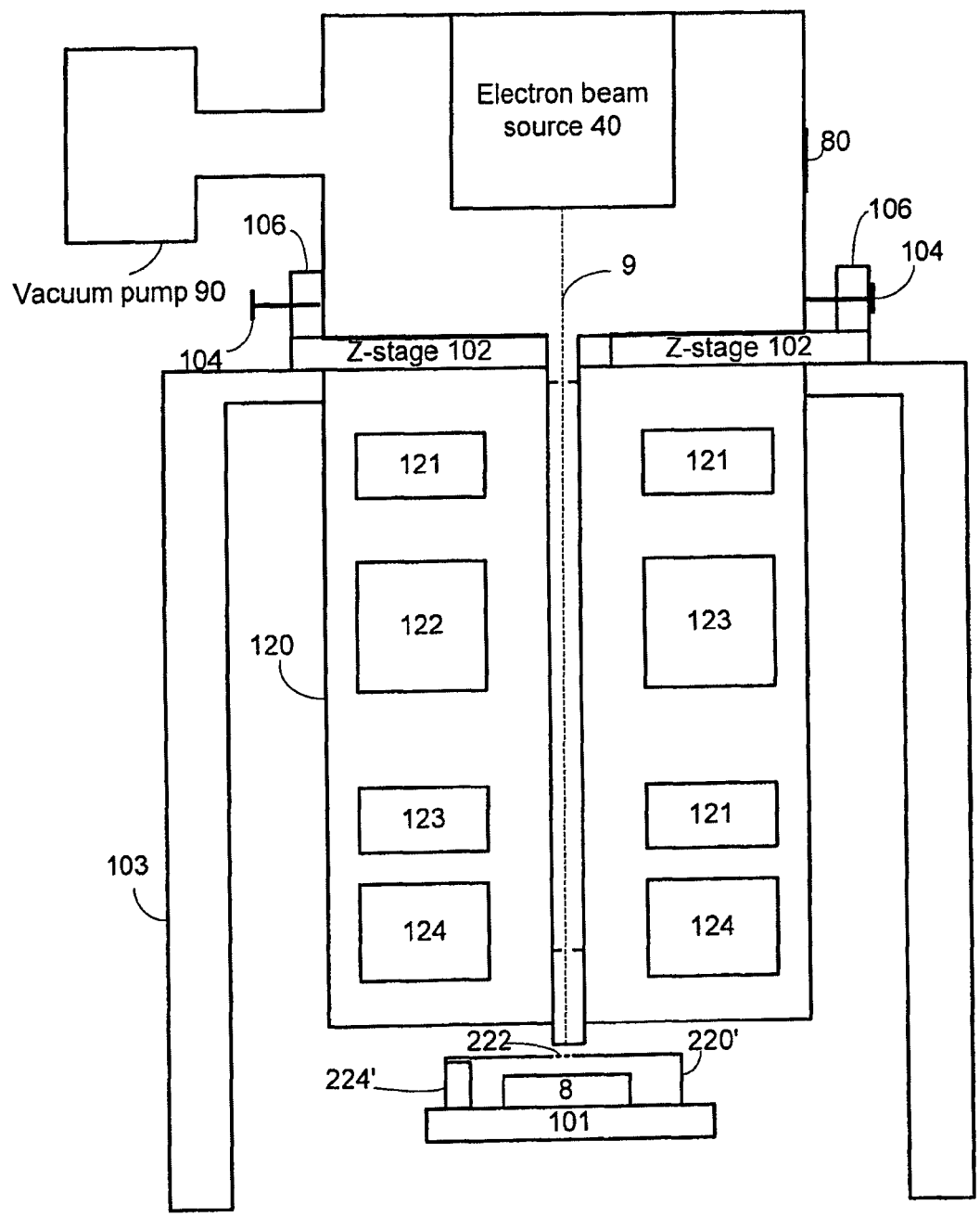
FIG. 12 is a schematic cross section of a SEM according to an embodiment of the invention.

FIG. 12 is a schematic cross section of SEM 10''' according to an embodiment of the invention.

SEM 10''' of FIG. 12 differs from SEM 10" of FIG. 11 by having an open ended chamber 222'. The open ended chamber 222' and the stage 101 define a closed compartment in which the object is located. The open ended chamber is equipped with (or connected to) controller 224'.

Figure 13:
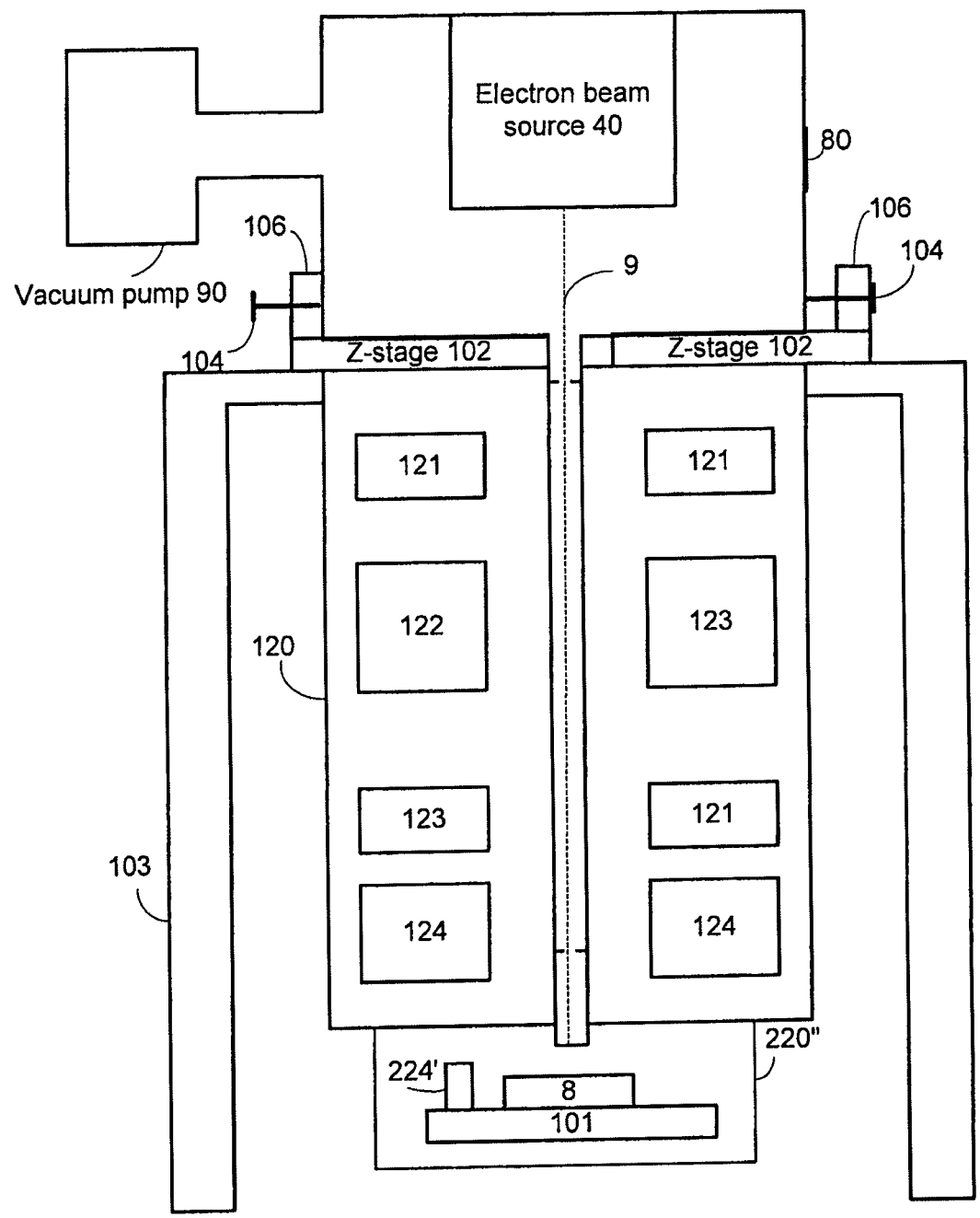
FIG. 13 is a schematic cross section of a SEM according to an embodiment of the invention.

FIG. 13 is a schematic cross section of SEM 10'''' according to an embodiment of the invention.

SEM 10'''' of FIG. 13 differs from SEM 10" of FIG. 11 by having an open ended chamber 222" that does not have a window. The open ended chamber 222" and a lower portion of non-vacuumed housing 120 define a closed compartment in which the object is located. The open ended chamber 222" is equipped with (or connected to) controller 224'.

It is noted that the chamber can be defined by stage 101, non-vacuumed housing 120 and additional structural components. The upper surface of stage 101 may form the lower part of the chamber while the lower surface of non-vacuumed housing 120 may form an upper portion of the chamber.

It is noted that when the chamber may be sealed, partially sealed or not sealed at all.

Figure 8:
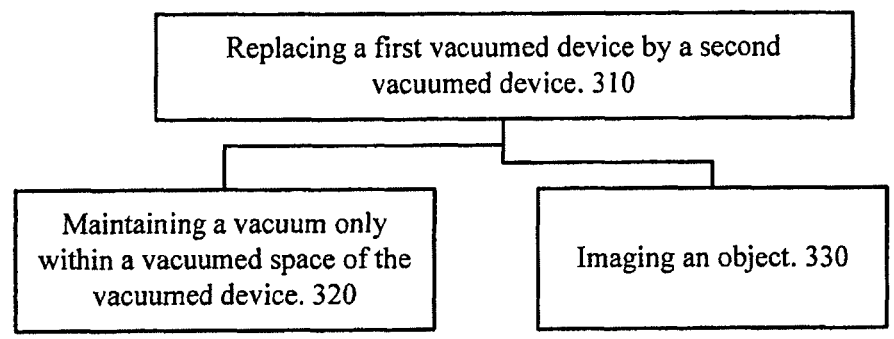
FIG. 8 illustrates a method for maintaining a scanning electron microscope, according to an embodiment of the invention.

FIG. 8 illustrates method 300 for maintaining a scanning electron microscope, according to an embodiment of the invention.

Method 300 starts by stage 310 of replacing a first vacuumed device by a replacing vacuumed device.

Stage 310 may include connecting the second vacuumed device to a non-vacuumed component of the scanning electron microscope in a releasable manner.

Stage 310 may include connecting the second vacuumed device to a non-vacuumed housing by inserting a first portion of a sealed housing of the vacuumed device into a space defined by one or more non-vacuumed components of the SEM.

Stage 310 may include replacing a replaced apparatus that includes the first vacuumed device and a vacuum pump.

Each of the second vacuumed device and the first vacuumed device includes a sealed housing, an electron beam source, an electron optic component, a thin membrane and a detector. The thin membrane seals an aperture of the sealed housing. The sealed housing defines a vacuumed space in which vacuum is maintained. The electron beam source is configured to generate an electron beam that propagates within the vacuumed space, interacts with the electron optic component and passes through the thin membrane.

Stage 310 is followed by stage 320 of maintaining a vacuum only within a vacuumed space of the vacuumed device. Accordingly, vacuum is not obtained and neither maintained within other parts of the SEM.

Method 300 may be applied to replace any of the apparatus and vacuumed devices of FIGS. 1-5 and may involve maintaining a SEM such as the SEM illustrated in FIG. 6.

Stage 310 may include at least one of the following operations: (i) unplugging cables connected to one or more connectors of the sealed housing such as unplugging detector cables, emitter cables or both; (ii) dismounting the first vacuumed device (or a replaced apparatus that includes the replaced vacuumed device); (iii) connecting the second vacuumed device in a releasable manner to one or more non-vacuumed components of the SEM—this may include inserting the vacuumed device (or at least a first portion of a sealed housing of the replacing vacuumed device) into an space defined by one or more non-vacuumed components of the SEM; (iv) connecting the detectors and emitter cables; (v) turning on the emitter; and (vi) aligning the vacuumed device relative to one or more non-vacuumed components.

Stage 310 may include determining to replace the replaced vacuumed device. The determining may be responsive to a degradation in the emitter performance such as brightness and stability; a degradation in the image quality due to contamination of the membrane, a malfunctioning of the vacuum pump, a degradation in detector performance, and the like Stage 310 may also be followed by stage 330 of imaging an object.

Figure 9:
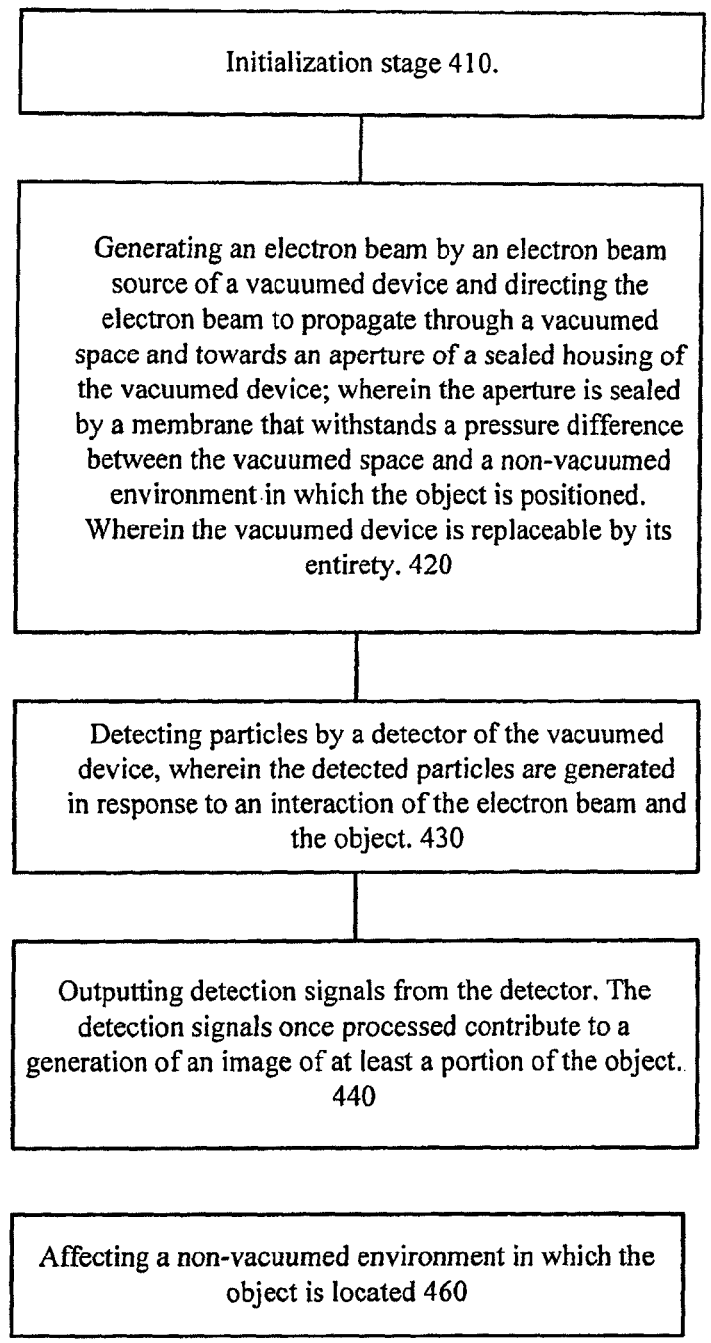
FIG. 9 illustrates a method for imaging an object, according to an embodiment of the invention.

FIG. 9 illustrates method 400 for imaging an object, according to an embodiment of the invention.

Method 400 starts by initialization stage 410. Initialization stage 410 may include placing an object on a stage of a SEM, setting one or more detector of the SEM, replacing a vacuumed device of the SEM and the like.

Stage 410 is followed by stage 420 of generating an electron beam by an electron beam source of a vacuumed device and directing the electron beam to propagate through a vacuumed space and towards an aperture of a sealed housing of the vacuumed device; wherein the aperture is sealed by a membrane that withstands a pressure difference between the vacuumed space and a non-vacuumed environment in which the object is positioned. Wherein the vacuumed device is replaceable by its entirety.

Stage 420 is followed by stage 430 of detecting particles by a detector of the vacuumed device, wherein the detected particles are generated in response to an interaction of the electron beam and the object.

Stage 430 is followed by stage 440 of outputting detection signals from the detector. The detection signals once processed contribute to a generation of an image of at least a portion of the object.

During stage 400 or at least during stages 420, 430 and 440 a first portion of the vacuumed device is placed within a space defined by at least one non-vacuumed component of a scanning electron microscope. The first portion of the vacuumed device is shaped to fit the space.

Method 400 may include stage 460 of affecting a non-vacuumed environment in which the object is located. Stage 460 may be executed in parallel to stages 420 and 430 but this is not necessarily so.

Stage 460 may include at least one of the following: introducing a gas to a non-vacuumed environment in which the object is located; introducing Nitrogen to a non-vacuumed environment in which the object is located; introducing He to a non-vacuumed environment in which the object is located; introducing a chemical to a non-vacuumed environment in which the object is located; controlling at least one parameter of a non-vacuumed environment within the chamber while the object is being imaged; wherein the object is positioned within a chamber when it is being imaged. The object is being imaged during stages 420-440.

Method 400 can be practiced by SEM 10 of FIG. 6.

The present invention can be practiced by employing conventional tools, methodology and components. Accordingly, the details of such tools, component and methodology are not set forth herein in detail. In the previous descriptions, numerous specific details are set forth, in order to provide a thorough understanding of the present invention. However, it should be recognized that the present invention might be practiced without resorting to the details specifically set forth.

Only exemplary embodiments of the present invention and but a few examples of its versatility are shown and described in the present disclosure. It is to be understood that the present invention is capable of use in various other combinations and environments and is capable of changes or modifications within the scope of the inventive concept as expressed herein.

We claim:

1. A vacuumed device comprising:
a sealed housing,
an electron beam source,
an electron optic component,
a thin membrane, and
a detector;
wherein the thin membrane seals an aperture of the sealed housing;
wherein the sealed housing defines a vacuumed space in which vacuum is maintained;
wherein the electron beam source is configured to generate an electron beam that propagates within the vacuumed space, interacts with the electron optic component and passes through the thin membrane;
wherein a first portion of the sealed housing is shaped to fit into a non-vacuumed space defined by non-vacuumed scanning electron microscope components that are maintained in a non-vacuum environment.

2. The vacuumed device according to claim 1 wherein the sealed housing comprises a single opening that is shaped to fit an output of a vacuum pump that is configured to maintain the vacuum in the vacuumed space.

3. The vacuumed device according to claim 1 wherein the first portion of the sealed housing has a cylindrical shape.

4. The vacuumed device according to claim 1 wherein the first portion of the sealed housing has a cylindrical shape and a millimetric diameter.

5. The vacuumed device according to claim 1 wherein the first portion of the sealed housing has a cylindrical shape and a diameter that ranges between 3 and 15 millimeter.

6. The vacuumed device according to claim 1 further comprising a second portion and wherein a cross section of the second portion is larger than a cross section of the first portion.

7. The vacuumed device according to claim 6 wherein the second portion is shaped to fit into an aligner that is configured to align the vacuumed device and at least one non-vacuumed component of a scanning electron microscope.

8. The vacuumed device according to claim 1 wherein the vacuumed device is configured to be coupled in a releasable manner to an aligner.

9. The vacuumed device according to claim 1 wherein the sealed housing has only a single opening.

10. The vacuumed device according to claim 1 wherein the sealed housing is a valve-less housing.

11. The vacuumed device according to claim 1 wherein a volume of the vacuumed space does not exceed a few hundred cubic centimeters.

12. The vacuumed device according to claim 1 wherein the housing comprises a detector connector.

13. The vacuumed device according to claim 1 wherein the vacuumed device substantially consists of the sealed housing, the electron beam source, the electron optic component, the thin membrane, and the detector.

14. The vacuumed device according to claim 1 wherein the vacuumed space is too small to include within it an alignment coil, a condenser lens, an astigmatism beam shift coil, a scanning coil or an objective lens.

15. An apparatus comprising a vacuumed device according to claim 1 and a vacuum pump coupled to the vacuumed device.

16. The apparatus according to claim 15 wherein the vacuum pump is characterized by a low throughput.

17. The apparatus according to claim 15 wherein the vacuum pump is characterized by a throughput that ranges between 2 and 3 liters per second.

18. The apparatus according to claim 15 wherein the vacuum pump is an ion pump.

19. The apparatus according to claim 15 wherein the vacuum pump is a battery powered vacuum pump.

20. An apparatus comprising a vacuumed device according to claim 1 and an aligner coupled to the vacuumed device; wherein the aligner is configured to align the vacuumed device and at least one non-vacuumed component of a scanning electron microscope.

21. A scanning electron microscope comprising:
non-vacuumed scanning electron microscope components that are maintained in a non-vacuum environment; wherein the non-vacuumed scanning electron microscope components define a non-vacuumed space; and
a vacuumed device comprising:
a sealed housing,
an electron beam source,
an electron optic component,
a thin membrane, and
a detector;
wherein the thin membrane seals an aperture of the sealed housing;
wherein the sealed housing defines a vacuumed space in which vacuum is maintained;
wherein the electron beam source is configured to generate an electron beam that propagates within the vacuumed space, interacts with the electron optic component and passes through the thin membrane; and
wherein a first portion of the sealed housing is shaped to fit into the non-vacuumed space.

22. The scanning electron microscope of claim 21 wherein the vacuumed device is configured to be coupled in a releasable manner to non-vacuumed components of the scanning, electron microscope.

23. The scanning electron microscope of claim 21 wherein the scanning electron microscope is configured to maintain vacuum only in the vacuumed space.

24. The scanning electron microscope of claim 21 further comprising a stage for supporting an object in a non-vacuumed environment.

25. The scanning electron microscope of claim 21 further comprising an aligner for aligning the vacuumed device and at least one non-vacuumed component of the scanning electron microscope.

26. The scanning electron microscope according to claim 21 further comprising a z-stage configured to change an elevation of the vacuumed device in relation to a stage of the scanning electron microscope.

27. The scanning electron microscope of claim 21 wherein the sealed housing comprises a single opening that is shaped to fit an output of a vacuum pump that is configured to maintain the vacuum in the vacuumed space.

28. The scanning electron microscope according to claim 21 further comprising at least one non-vacuumed detector.

29. The scanning electron microscope according to claim 21 wherein the non-vacuumed components of the scanning electron microscope comprise at least one of an alignment coil, a condenser lens, an astigmatism beam shift coil, a scanning coil and an objective lens.

30. The scanning electron microscope according to claim 24 further comprising a chamber and a controller for controlling at least one parameter of a non-vacuumed environment within the chamber and wherein the chamber is configured to receive the object.

31. The scanning electron microscope according to claim 24 further comprising a chamber and a controller for controlling at least one parameter of a non-vacuumed environment within the chamber while the object is being imaged and wherein the object is positioned within the chamber when it is being imaged.

32. The scanning electron microscope according to claim 24 further comprising a gas introducer for introducing a gas to a non-vacuumed environment in which the object is located.

33. The scanning electron microscope according to claim 24 further comprising a gas introducer for introducing Nitrogen to a non-vacuumed environment in which the object is located.

34. The scanning electron microscope according to claim 24 further comprising a gas introducer for introducing He to a non-vacuumed environment in which the object is located.

35. The scanning electron microscope according to claim 24 further comprising an introducer for introducing a chemical to a non-vacuumed environment in which the object is located.

36. A method for maintaining a scanning electron microscope, the method comprising:
    replacing a first vacuumed device by a second vacuumed device, wherein the replacing comprises connecting the second vacuumed device to a non-vacuumed component of the scanning electron microscope in a releasable manner.

37. The method according to claim 36 wherein the replacing is followed by maintaining a vacuum only within a vacuumed space of the second vacuumed device.

38. The method according to claim 36 wherein each of the second vacuumed device and the first vacuumed device comprises a sealed housing, an electron beam source, an electron optic component, a thin membrane, and a detector; wherein the thin membrane seals an aperture of the sealed housing; wherein the sealed housing defines a vacuumed space in which vacuum is maintained; wherein the electron beam source is configured to generate an electron beam that propagates within the vacuumed space, interacts with the electron optic component and passes through the thin membrane; and wherein a first portion of the sealed housing is shaped to fit into a non-vacuumed space.

39. The method according to claim 36 further comprising imaging an object.

40. A method for imaging an object, the method comprising:
    generating an electron beam by an electron beam source of a replaceable vacuumed device;
    directing the electron beam to propagate through a vacuumed space and towards an aperture of a sealed housing of the replaceable vacuumed device; wherein the aperture is sealed by a membrane that withstands a pressure difference between the vacuumed space and a non-vacuumed environment in which the object is positioned;
    detecting particles by a detector of the vacuumed device, wherein the detected particles are generated in response to an interaction of the electron beam and the object; and
    outputting detection signals from the detector; wherein the detection signals once processed contribute to a generation of an image of at least a portion of the object;
    wherein during the stages of generating and detecting a first portion of the vacuumed device is placed within a non-vacuumed space defined by at least one non-vacuumed component of a scanning electron microscope, and
    wherein the first portion of the vacuumed device is shaped to fit into the non-vacuumed space.

41. The method according to claim 40 further comprising introducing a gas to a non-vacuumed environment in which the object is located.

42. The method according to claim 40 further comprising introducing Nitrogen to a non-vacuumed environment in which the object is located.

43. The method according to claim 40 further comprising introducing He to a non-vacuumed environment in which the object is located.

44. The method according to claim 40 further comprising introducing a chemical to a non-vacuumed environment in which the object is located.

45. The method according to claim 40 further comprising controlling at least one parameter of a non-vacuumed environment within a chamber while the object is being imaged; wherein the object is positioned within the chamber when it is being imaged.

* * * * *